United States Patent
Walker et al.

(10) Patent No.: US 7,922,522 B2
(45) Date of Patent: Apr. 12, 2011

(54) INSTRUMENT HAVING OBLIQUE MOUNTED TERMINAL POSTS

(75) Inventors: Richard W. Walker, Alpine, UT (US); David W. Farley, Orem, UT (US); Jeff M. Elrod, Seattle, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 12/417,500

(22) Filed: Apr. 2, 2009

(65) Prior Publication Data

US 2010/0255715 A1   Oct. 7, 2010

(51) Int. Cl.
*H01R 13/60* (2006.01)
(52) U.S. Cl. .................... 439/534; 439/954; 439/713
(58) Field of Classification Search .................. 439/534, 439/954, 713
See application file for complete search history.

(56) References Cited

U.S. PATENT DOCUMENTS

| | | | | |
|---|---|---|---|---|
| 1,669,209 | A * | 5/1928 | Ribaysen | 439/534 |
| 3,073,891 | A * | 1/1963 | Barengoltz | 174/161 R |
| 3,848,958 | A | 11/1974 | Kern | 339/198 R |
| 4,171,152 | A | 10/1979 | Geiseler | 339/272 A |
| 4,331,377 | A | 5/1982 | Ebbinghaus et al. | 339/272 A |
| 5,292,263 | A | 3/1994 | Mosser et al. | 439/812 |
| 5,639,261 | A * | 6/1997 | Rutkowski et al. | 439/534 |
| 5,664,971 | A | 9/1997 | Coy | 439/811 |
| D389,801 | S | 1/1998 | Foye | D13/147 |
| D405,092 | S | 2/1999 | Ohshima et al. | D14/239 |
| D421,965 | S | 3/2000 | Johnston et al. | D13/147 |
| 6,375,511 | B1 * | 4/2002 | Yu | 439/631 |
| D465,216 | S | 11/2002 | Zdinak et al. | D14/240 |
| 6,537,106 | B1 * | 3/2003 | Follingstad | 439/534 |
| D477,570 | S | 7/2003 | Zdinak et al. | D13/147 |
| 6,638,104 | B2 * | 10/2003 | Hashimoto et al. | 439/567 |
| 6,923,662 | B2 * | 8/2005 | Sasame et al. | 439/79 |
| 6,986,670 | B2 * | 1/2006 | Okura et al. | 439/74 |
| 7,086,866 | B1 * | 8/2006 | Folan et al. | 439/53 |
| 7,179,119 | B2 * | 2/2007 | Follingstad | 439/534 |
| 7,223,119 | B2 * | 5/2007 | Droesbeke | 439/456 |
| 7,534,135 | B2 * | 5/2009 | Follingstad | 439/534 |
| 2008/0132126 | A1 | 6/2008 | Hyland et al. | 439/810 |
| 2008/0232743 | A1 | 9/2008 | Gronvall et al. | 385/77 |

FOREIGN PATENT DOCUMENTS

| | | |
|---|---|---|
| DE | 32 31 690 | 3/1984 |
| GB | 1 245 905 | 9/1971 |
| JP | 9-229722 | 9/1997 |
| JP | 2003-109688 | 4/2003 |

OTHER PUBLICATIONS

Extended European Search Report, EP Application No. 10158475.3, Aug. 20, 2010, 3 pgs.

* cited by examiner

*Primary Examiner* — Gary F. Paumen
(74) *Attorney, Agent, or Firm* — Dorsey & Whitney LLP

(57) ABSTRACT

The present invention is directed to an instrument having at least one terminal post having a longitudinal axis extending therefrom such that the longitudinal axis is at an oblique angle relative to a surface of the instrument. In one embodiment, each terminal post is mounted to a circuit board such that a first surface of each terminal post projects in a first direction. In this embodiment, a rear surface of each terminal post is beveled and coupled to a first surface of the circuit board. The beveled rear surface of the terminal posts defines the oblique angle at which the longitudinal axis of the each terminal post is relative to a surface of the instrument.

20 Claims, 5 Drawing Sheets

INSTRUMENT HAVING OBLIQUE MOUNTED TERMINAL POSTS

TECHNICAL FIELD

Embodiments of the present invention are directed toward test, measurement, and calibration instruments having at least one terminal post.

BACKGROUND OF THE INVENTION

Test, measurement, and calibration instruments, such as multimeters, temperature calibrators and the like, have input/output (I/O) ports to couple the instrument to an external electrical device. Each I/O port includes a terminal or binding post which electrically couples a connector of an external device to the I/O port of the instrument. Typically, terminal posts are versatile, and in many cases may accept banana plugs, alligator clips, bare wires, spade lugs, fork connectors, and other electrical connectors. Often many terminal posts are arranged together on a panel of the test instrument. Due to space limitations many terminal posts are arranged in close proximity with each other.

A panel 110 of an instrument 100, such as a calibration instrument, having a conventional terminal post configuration is shown in FIG. 1. The panel 110 has a plurality of terminal posts 101 arranged on it. The terminal posts 101 protrude out from the panel 110 of the instrument 100 so that a longitudinal axis of each terminal post 101 is approximately perpendicular with the panel 110 of the instrument 100. Connectors 102, in this example spade lugs, are coupled to a respective one of the terminal posts 101 to electrically connect an external device to the instrument 100 through a test lead or wire 103 that is coupled to the connector 102. As can be seen in FIG. 1, a rigid portion of the wire extends from a side of the terminal post and often runs into adjacent terminal posts. For instance, wire 103a is coupled to connector 102a. The connector 102a is clamped by the terminal post 101a such that the wire 103a extends from a side of the terminal post 101a and runs into adjacent terminal post 110b.

As can be seen from the Figure, attaching a connector to a terminal post can be very difficult, particularly when the terminal posts are located in close proximity with one another. Additionally, when the terminal posts are arranged on an instrument too close together, the rigid part of the wire that runs into adjacent terminal posts may prevent the connector from making good electrical contact or make unwanted contact with an adjacent terminal. Furthermore, the rigid part of the wire can wear out prematurely due to excessive strain caused by bending around adjacent terminal posts. Due to the above mentioned problems, terminal posts generally require a fair amount of space on the panel of the instrument so that a user has enough space to properly install a connector and prevent the premature wearing of the connector.

There is, therefore, a need for a system and method of arranging terminal posts on test instruments so that attaching connectors to the terminal posts is easier. Additionally, there is a need for a system and method for allowing terminal posts to be arranged closer together while preventing the problems discussed above.

SUMMARY OF THE INVENTION

The present invention is directed toward an instrument, such as a calibration instrument, having at least one terminal post positioned at an angle relative to a surface on the instrument. One aspect of the invention is directed to an instrument having an outer surface and a plurality of conductive terminals coupled to the instrument. The conductive terminals may be coupled to the instrument such that a longitudinal axis of each of the plurality of conductive terminals are at an oblique angle relative to the outer surface.

Another aspect of the invention is directed to a connection panel having a circuit board having a first surface and a plurality of conductive terminals. Each of the conductive terminals may have a beveled back surface. The beveled back surface of the conductive terminals may be mounted on the first surface of the circuit board such that a longitudinal axis of the conductive terminals is at an oblique angle relative to the first surface of the circuit board.

DETAILED DESCRIPTION OF PREFERRED EMBODIMENTS

Embodiments of the present invention are directed toward test, measurement, and calibration instruments having at least one binding or terminal post. In particular, many embodiments are directed to at least one terminal post positioned at an angle relative to a surface on the instrument. Certain details are set forth below to provide a sufficient understanding of the embodiments of the invention. However, it will be clear to one skilled in the art that various embodiments of the invention may be practiced without these particular details. In other instances, well known electrical circuits and signals have not been shown in detail in order to avoid unnecessarily obscuring the invention.

Figure 1:
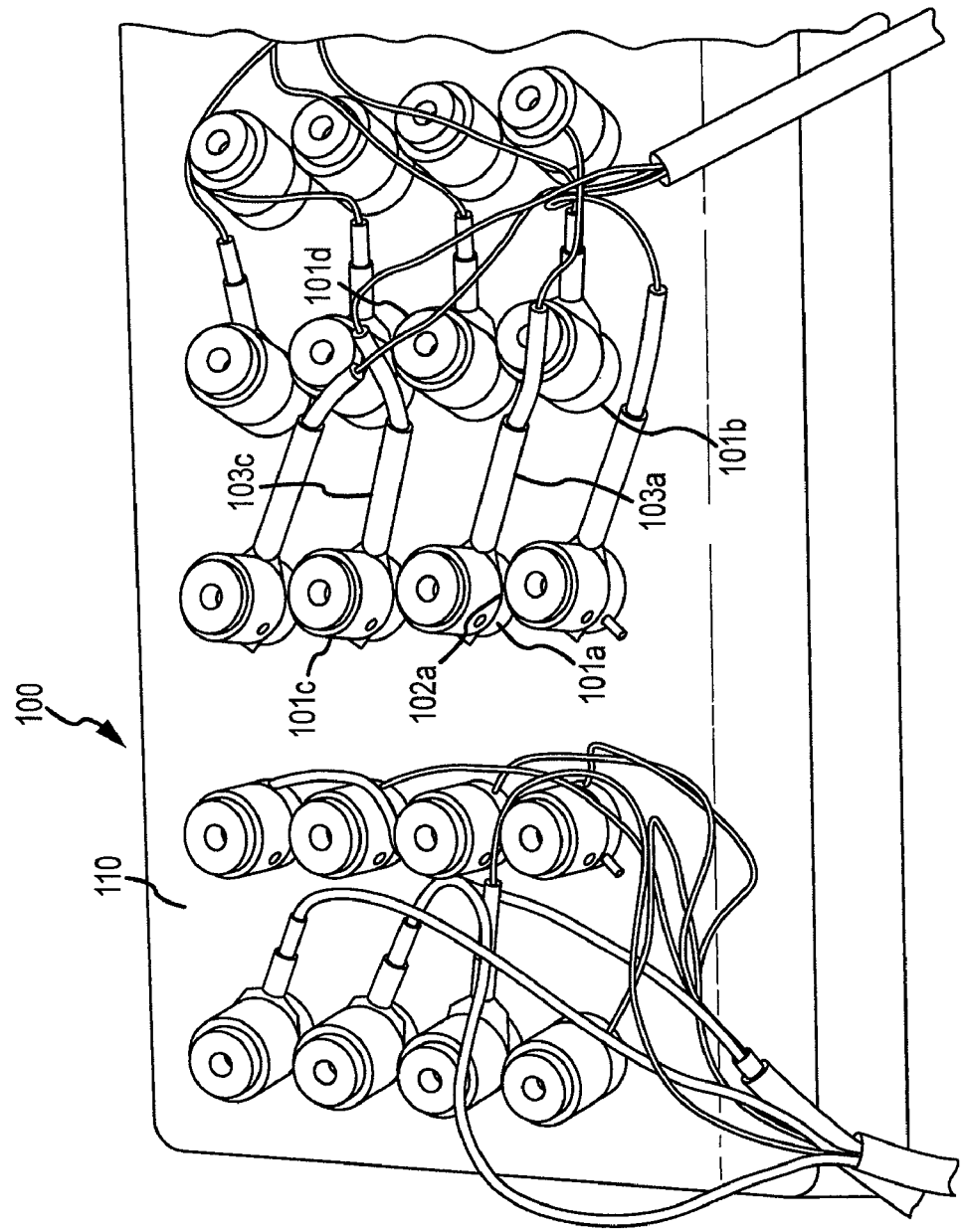
FIG. 1 is an isometric view of an instrument in accordance with prior art.
Figure 2:
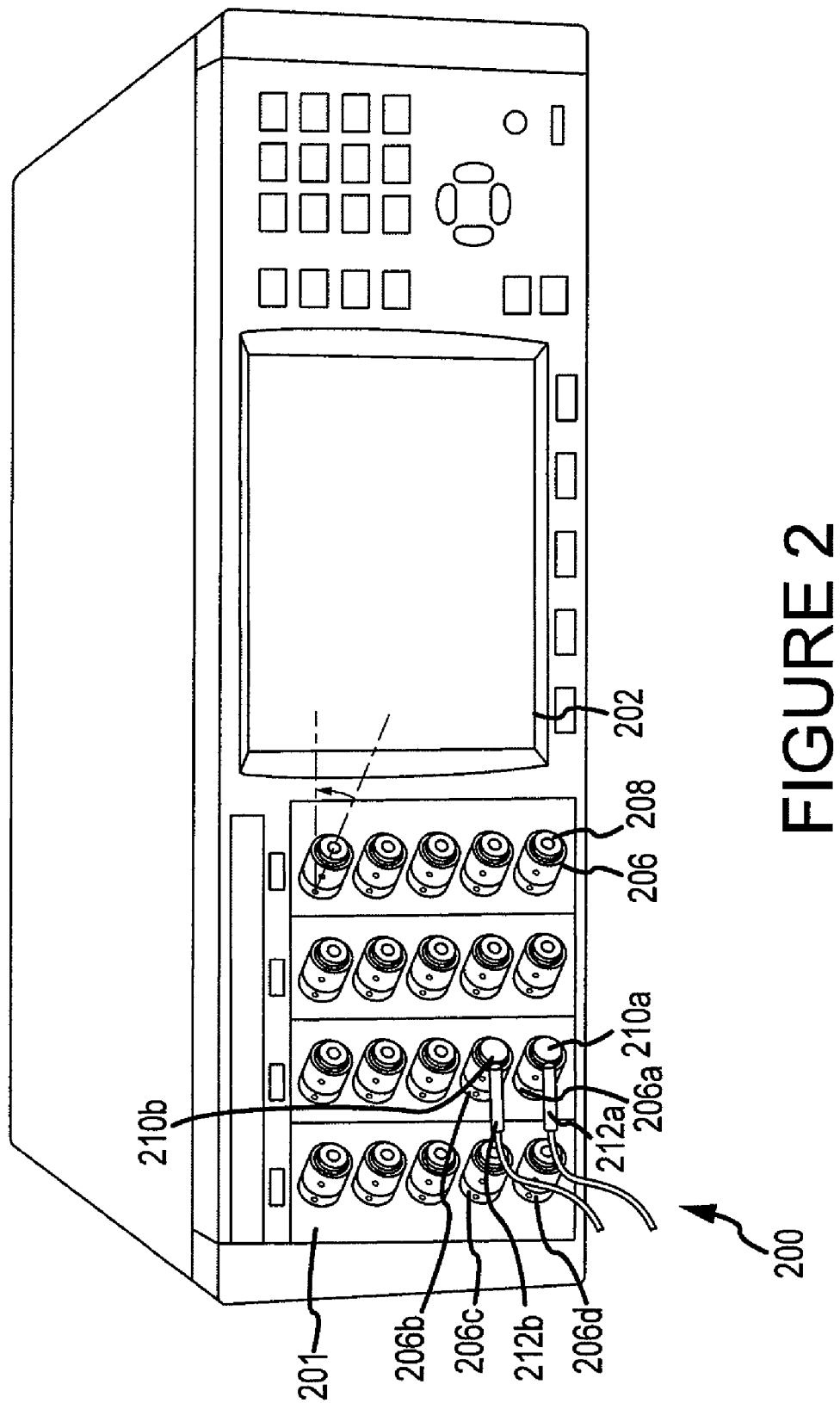
FIG. 2 is an isometric view of an instrument according to one embodiment of the invention.

FIG. 2 is an isometric view of an instrument 200 according to one embodiment of the invention. The instrument 200 has a display and a panel 201 having an outer surface. A plurality of terminal posts 206 are arranged on the panel 201 in an array configuration. As discussed above, the terminal posts 206 provide electrical connection from the instrument 200 to another electrical device to be tested, calibrated, and/or measured. The terminal posts 206 are operable to accept a variety of connectors 210, such as banana plugs, alligator clips, bare wires, spade lugs, fork connectors or other electrical connectors. Each connector 210 is coupled to the electrical device through a wire or test lead 212. For instance, in the embodiment shown, banana plugs 210a and 210b are coupled to the respective terminal post 206a and 206b. The terminal posts 206 in the embodiment shown in FIG. 2 are arranged on the panel 201 of the instrument 200 in an array configuration. However, as will be clear to a person having ordinary skill in the art, the terminal posts 206 may be arranged on the panel of the instrument in any configuration.

Each terminal post 206 has a first surface 208 at an end of the terminal post 206. In the embodiment shown in FIG. 2, the first surface 208 of each terminal post 206 is positioned such that the first surface 208 is facing the same direction. The terminal posts 206 project away from the instrument 200 at an oblique angle relative to the panel 201. Therefore, rather than having terminal posts 206 extending away from the panel 201 of the instrument 200 so that a longitudinal axis of the terminal post 206 is perpendicular with the panel 201 of the instrument 200, the terminal posts 206 extend away from the panel 201 of the instrument 200 so that a longitudinal axis of the terminal posts 206 are at an oblique angle relative to the panel 201. In some embodiments, the longitudinal axis of the terminal posts 206 are angled between 35° and 75° relative to the panel 201. In other embodiments, the terminal posts 206 are angled between 45° and 65° relative to the panel 201. In other embodiments still, the terminal posts 206 are angled between 50° and 60° relative to the panel 201. In one embodiment the terminal posts 206 are angled approximately 55° relative to the panel 201.

Angling the terminal posts 206 relative to the panel 201 of the instrument 200, provides more available space for each respective connector 210 and its corresponding wire 212. For instance, as can be seen by connector 206a and 206b in FIG. 2, the rigid part of the wire 212a and 212b, respectively, extending from the side of the corresponding connector 206a and 206b does not run into the adjacent terminal posts 206c and 206d. Rather, the rigid part of the wires 212a and 212b extends above the adjacent terminal posts 206c and 206d. In some embodiments, this arrangement of the terminal posts 206 allows the terminal posts 206 to be arranged closer together than conventional arrangements.

Figure 3:
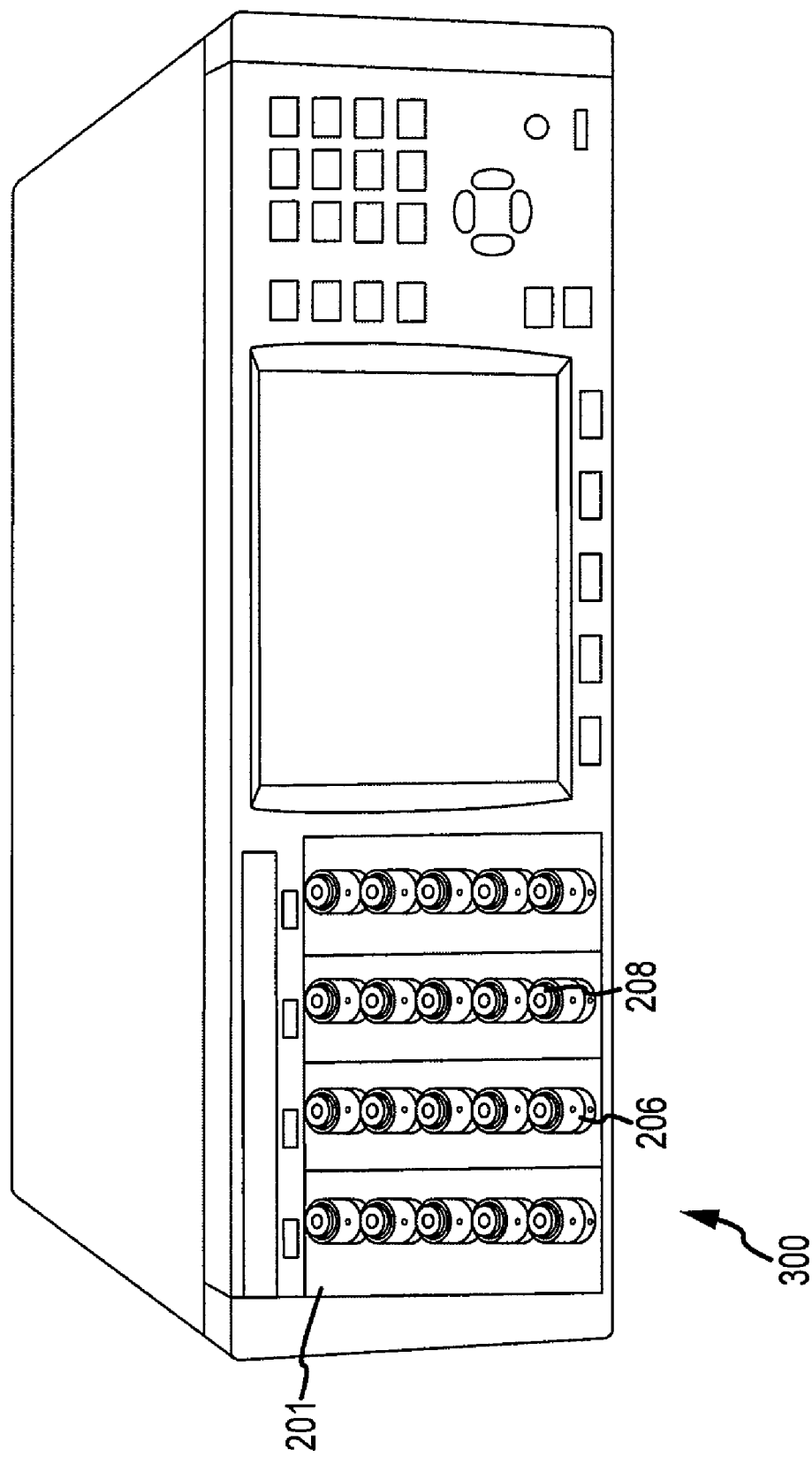
FIG. 3 is an isometric view of an instrument according to one embodiment of the invention.

Although the embodiment shown in FIG. 2 shows that the terminal posts 206 are angled so that the first surface 208 of each terminal posts 206 projects in a particular direction, as will be clear to a person having ordinary skill in the art, the terminal posts 206 may be angled in any direction. For instance, in the embodiment shown in FIG. 3 the terminal posts 206 are angled such that the first surface 208 of each terminal post 206 projects in an upward direction. Many of the components of the instrument 300 shown in FIG. 3 are used in the instrument 200 in FIG. 2. Therefore, in the interest of brevity an explanation of their structure and function will not be repeated. As indicated above, the terminal posts 206 in the instrument 300 are angled such that a first surface 208 of each terminal post 206 projects in an upward direction. That is a longitudinal axis of each terminal post 206 is at an acute angle with a panel 201 of the instrument 300 just above the terminal post 206. In another embodiment, the terminal posts 206 may be angled such that the first surface 208 of each terminal post 206 is angled downwardly. In yet another embodiment, some of the terminal post 206 are angled in a first direction, while other terminal posts 206 are angled in a second direction or a plurality of different directions.

Figure 4:
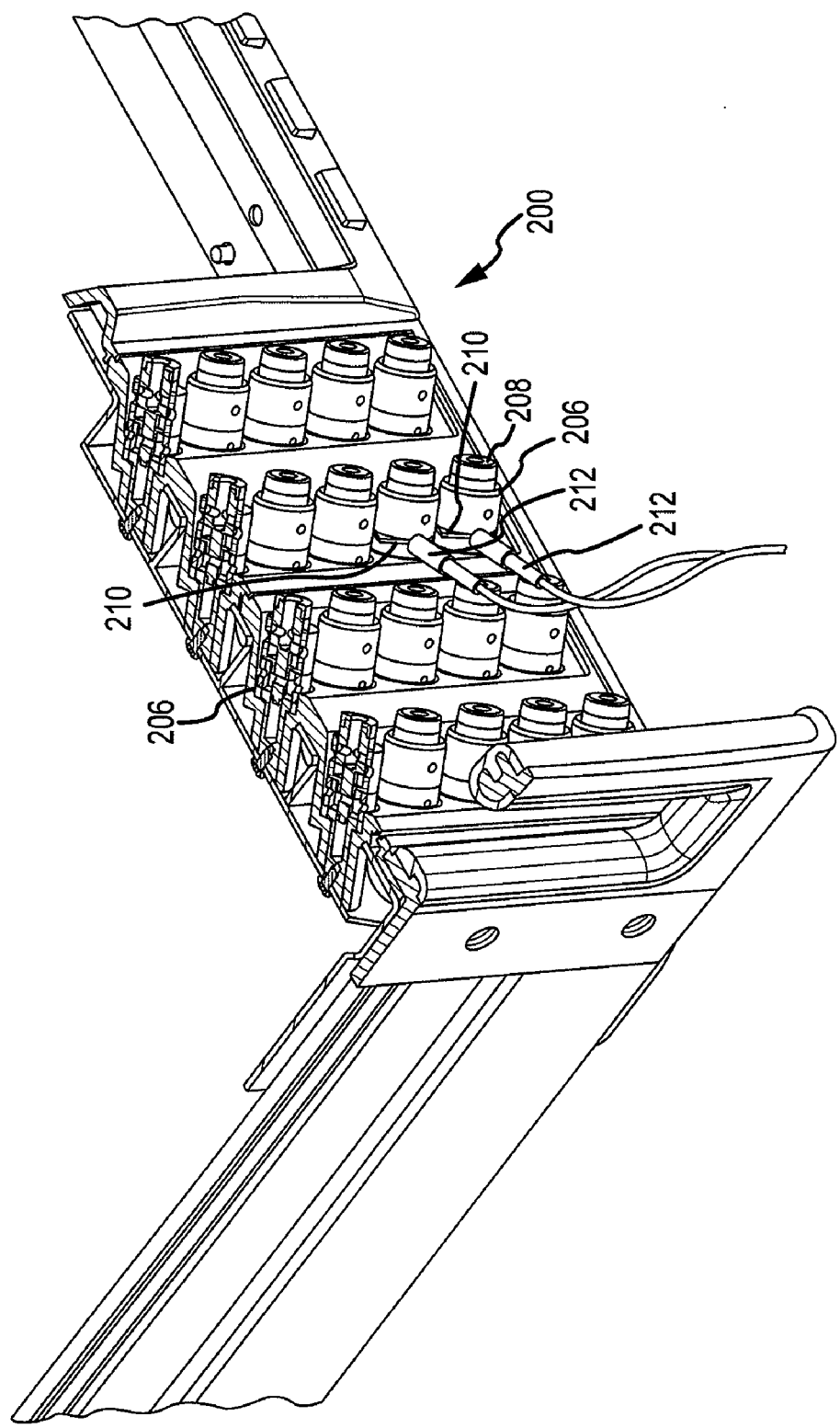
FIG. 4 is a cross sectional schematic illustration of an instrument according to one embodiment of the invention.
Figure 5:
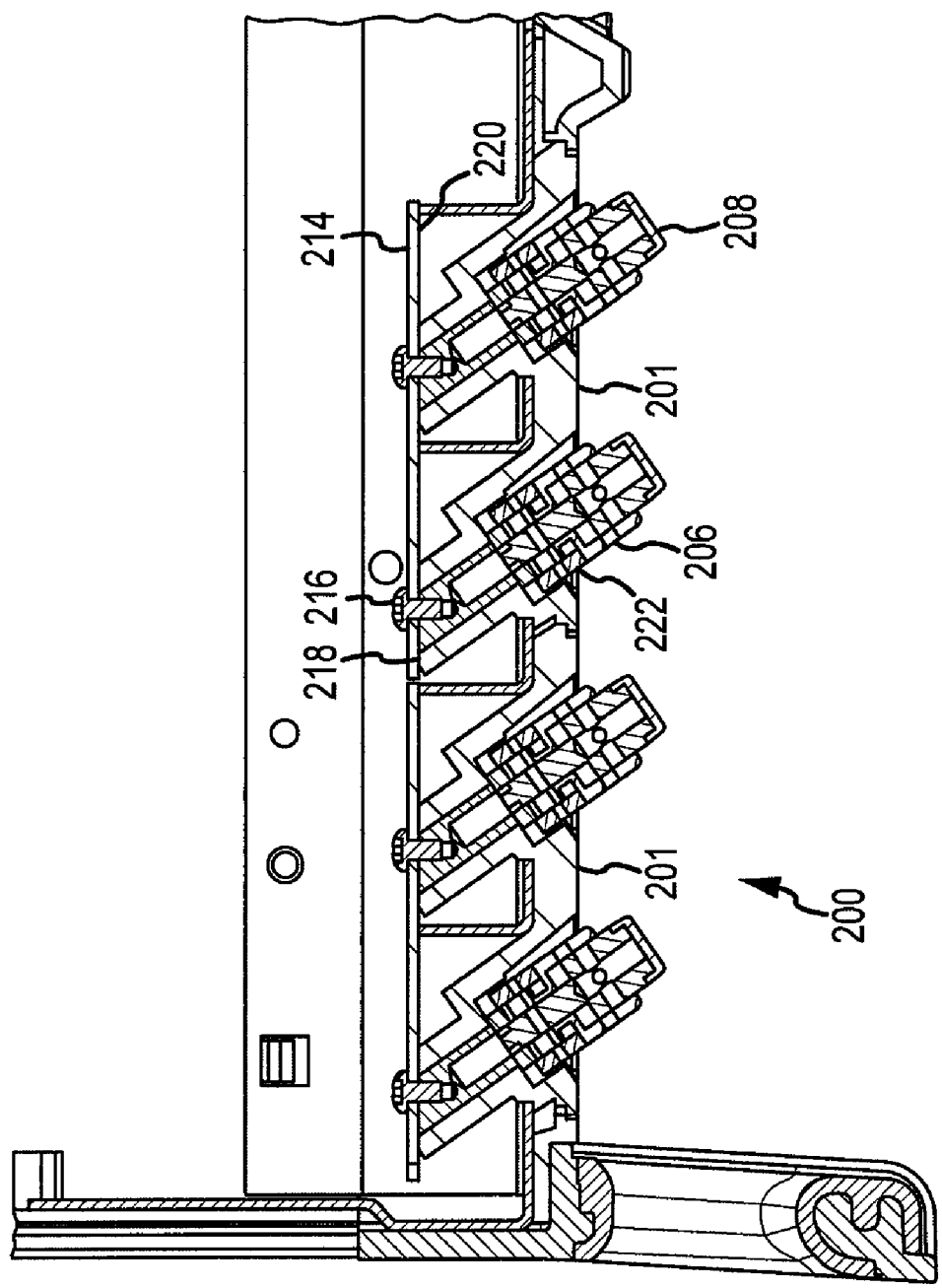
FIG. 5 is a schematic illustration of a top down view of the terminal posts shown in cross section in FIG. 4.

FIG. 4 is a cross sectional schematic illustration of an instrument having oblique terminal posts 206 according to one embodiment of the invention. Most of the components on FIG. 4 are used in the instrument shown in FIG. 2. Therefore, in the interest of brevity, an explanation of their structure and function will not be repeated. FIG. 4 shows an instrument 200 having a plurality of obliquely mounted terminal posts 206 arranged in an array configuration. A first row of terminal posts 206 are provided in cross section. FIG. 5 is a schematic illustration of a top down view of the terminal posts 206 shown in cross section in FIG. 4. Connectors 210, in this embodiment spade lugs, are coupled to the terminal posts 206 such that a wire or test lead 212 coupled to the connector 210 projects from a side of the respective terminal post 206. As in the embodiment shown in FIG. 2, the wires 212 project from the connectors 210 so that the wires 212 extend in front of an adjacent connector 210 without running into it.

As can be best seen in FIG. 5, a portion of each terminal post 206 is provided through an opening 222 in the panel 201 of the instrument 200. Each terminal post 206 is mounted to a circuit board 214 by a screw 216. In particular, a rear surface 218 of each terminal post 206 abuts a front surface 220 of the circuit board 214. In the embodiment shown in FIG. 5, the rear surface 218 of each of the terminal posts 206 is beveled. In one embodiment, the angle of the bevel on the rear surface 218 of the terminal post 206 defines the angle in which the terminal post 206 projects from the panel 201 of the instrument 200. Therefore, to obtain a terminal post 206 that is angled approximately 55° relative to the panel 201 of the instrument 200 or approximately 35° relative to an axis that is perpendicular to the panel 201, the rear surface 218 of the terminal post 206 is beveled to a 35° angle. Thus, the beveled rear surface 218 of the terminal post 206 abuts the front surface 220 of the circuit board 214. As will be clear to a person having ordinary skill in the art, the angle of the circuit board 214 relative to the panel 201 of the instrument 200 may define or at the very least contribute to determining the angle in which the terminal posts 206 extend from the panel 201 of the instrument 200.

In some embodiments, the terminal posts 206 are adjustable. In particular, the terminal posts 206 may be adjustable so that the first surface 208 of each terminal posts 206 projects in a different direction. In one embodiment, the terminal posts 206 may be adjusted so that the first surface 208 projects in a different direction, while substantially maintaining a particular acute angle of the longitudinal axis of the terminal post 206 relative to the panel 201. For instance, as will be clear to a person having ordinary skill in the art, the terminal posts 206 may be coupled to the circuit board 214 such that the terminal posts 206 are rotatable relative to the circuit board 214 or the terminal posts 206, themselves, may be rotatable. In one embodiment, terminal posts 206 are able to rotate a full 360 degrees. Thus, a user may be able to determine the direction in which the first surface 208 of each terminal post 206 projects.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

What is claimed is:

1. An instrument, comprising:
   an outer surface;
   a plurality of conductive terminal posts coupled to the instrument and configured to align a longitudinal axis of at least one of the plurality of conductive terminal posts at an oblique angle relative to the outer surface; and
   at least one of the plurality of conductive terminal posts is configured to be secured to the instrument by a screw and further configured to carry one signal at a time.

2. The instrument of claim 1, wherein the oblique angle is between 45° and 65°.

3. The instrument of claim 1, wherein the oblique angle is approximately 55°.

4. The instrument of claim 1, wherein at least one of the plurality of conductive terminal posts and another of the plurality of conductive terminal posts are at substantially the same angle.

5. The instrument of claim 1 wherein the conductive terminals are rotatable such that when each of the conductive terminals are rotated the first surface of each of the conductive terminals are facing in a second direction, the second direction being different from the first.

6. The instrument of claim 1, wherein a first surface of a first set of conductive terminal posts are facing a first direction and a second surface of a second set of conductive terminal posts are facing a second direction.

7. The instrument of claim 1, wherein a longitudinal axis of the screw intersects the longitudinal axis of at least one of the plurality of conductive terminal posts.

8. A connection panel, comprising:
a circuit board having a first surface; and
a plurality of terminal posts, at least one of the terminal posts having a beveled back surface, the beveled back surface of the at least one terminal post mounted on the first surface of the circuit board by a screw;
wherein the at least one terminal post is configured to carry one signal at a time and has a longitudinal axis at an oblique angle relative to the first surface of the circuit board.

9. The connection panel of claim 8, wherein the beveled back surface defines the oblique angle.

10. The connection panel of claim 8, wherein the beveled back surface of the at least one terminal post and another terminal post are at substantially the same angle.

11. The connection panel of claim 8, wherein the longitudinal axis of the screw intersects the longitudinal axis of at least one of the plurality of terminal posts.

12. The connection panel of claim 8 wherein each of the conductive terminal posts is rotatable relative to the circuit board.

13. The connection panel of claim 8, wherein the oblique angle is between approximately 50° and 60°.

14. The connection panel of claim 8, wherein the circuit board is used for testing, calibration, or measurement.

15. A method of coupling a plurality of conductors to respective conductive terminal posts of an instrument, comprising:
securing a plurality of conductive terminal posts to a first surface of the instrument using a plurality of corresponding screws wherein a longitudinal axis of at least one of the conductive terminal posts is positioned at an oblique angle relative to the first surface of the instrument; and
connecting at least one of the plurality of conductors to at least one of the plurality of conductive terminal posts.

16. The method of claim 15, further comprising:
positioning at least a first and a second of the plurality of conductive posts at substantially the same angle relative to the outer surface of the instrument.

17. The method of claim 15, wherein at least one of the conductive terminal posts project from the first surface of the instrument at approximately between 50° and 60° relative to the face of the instrument.

18. The method of claim 15, wherein the longitudinal axis of at least one of the conductors is substantially perpendicular to the longitudinal axis of a corresponding at least one of the conductive terminal posts.

19. The method of claim 18, wherein a longitudinal axis of at least one of the conductors projects over an outer end of at least one of the conductive terminal posts.

20. The method of claim 15, wherein a longitudinal axis of at least one of the conductors is substantially parallel to the longitudinal axis of a corresponding at least one of the conductive terminal posts.

* * * * *